United States Patent
Buter et al.

(10) Patent No.: US 8,451,161 B2
(45) Date of Patent: May 28, 2013

(54) SWITCHED-CAPACITOR PIPELINE STAGE

(75) Inventors: Berry Anthony Johannus Buter, Veldhoven (NL); Hans Van de Vel, Geel (BE)

(73) Assignee: Integrated Device Technology, Inc., San Jose, CA (US)

( * ) Notice: Subject to any disclaimer, the term of this patent is extended or adjusted under 35 U.S.C. 154(b) by 44 days.

(21) Appl. No.: 13/123,615

(22) PCT Filed: Oct. 5, 2009

(86) PCT No.: PCT/IB2009/054345
§ 371 (c)(1),
(2), (4) Date: Apr. 11, 2011

(87) PCT Pub. No.: WO2010/043999
PCT Pub. Date: Apr. 22, 2010

(65) Prior Publication Data
US 2011/0193736 A1      Aug. 11, 2011

(51) Int. Cl.
*H03M 1/12* (2006.01)
(52) U.S. Cl.
USPC .......................................... 341/172; 341/155
(58) Field of Classification Search
USPC ................. 341/172, 161, 118, 120, 131, 155, 341/162, 163
See application file for complete search history.

(56) References Cited

U.S. PATENT DOCUMENTS 6,456,223 B1 * 9/2002 Yu et al. .................. 341/161
7,009,549 B1 3/2006 Corsi

FOREIGN PATENT DOCUMENTS

| CN | 1877999 A | 12/2006 |
|---|---|---|
| CN | 1929315 A | 3/2007 |

OTHER PUBLICATIONS

Lewis, S., et al. "A Pipelined 5-Msample/s 9-bit Analog-to-Digital Converter", IEEE J. of Solid-State Circuits, vol. sc-22, No. 6 (Dec. 1987).

Lewis, S., et al. "A 10-b 20-Msample/s Analog-to-Digital Converter", IEEE J. of Solid-State Circuits, vol. 27, No. 3, pp. 351-358 (Mar. 1992).

(Continued)

*Primary Examiner* — Joseph Lauture
(74) *Attorney, Agent, or Firm* — Hayes and Boone LLP

(57) ABSTRACT

A circuit for an N-bit stage ($110_i$) of a pipeline ADC having $L=2^N$ levels, the circuit comprising: an operational amplifier (420); a first feedback capacitor ($C_{f1}$) having a first plate connected to an input of the operational amplifier and a second plate switchably connected on a first clock signal ($\phi 1$) to a first input voltage ($\pm V_m$) and on a second clock signal ($\phi 2$) to an output of the operational amplifier; a second feedback capacitor ($C_{f2}$) having a first plate connected to the input of the operational amplifier and a second plate switchably connected on the first clock signal to a discharge connection and on the second clock signal ($\phi 2$) to an output of the operational amplifier; and a plurality of K sampling capacitors ($C_u$), each sampling capacitor having a first plate connected on the first clock signal to the input of the operational amplifier and a second plate switchably connected on the first clock signal to a second input voltage ($V_{in}$) and on the second clock signal to one of a positive and negative reference voltage ($+V_{ref}$, $-V_{ref}$) dependent on a quantized value of an analog input signal (Vm).

10 Claims, 5 Drawing Sheets

OTHER PUBLICATIONS

You, S-B., et al. "A 3.3V 14-bit 10MSPS Calibration-Free CMOS Pipelined A/D Converter", IEEE Proc. IEEE Symp. on Circuits & Systems, vol. 1, pp. 1435-1438 (May 2000).

Myers, C., et al. "Low Voltage High-SNR Pipeline Data Converters", 2$^{nd}$ Annual IEEE NE Workshop on Circuits and Systems, pp. 245-248 (Jun. 2004).

Ahn, G., et al. "A 12b 10MS/s Pipelined ADC Using Reference Scaling", IEEE 2006 Symp. On VLSI Circuits Digest of Technical Papers, 2 pages (2006).

International Search Report and Written Opinion for Int'l. Patent Application No. PCT/IB2009/054345 (Mar. 8, 2010).

First Office Action mailed Mar. 5, 2013, in related Chinese Patent Application No. 200980140543.0.

* cited by examiner

SWITCHED-CAPACITOR PIPELINE STAGE

The invention relates to switched-capacitor circuits for analog-to-digital converters (ADCs) having a pipeline architecture, and in particular to circuit designs allowing for both reference and range scaling.

A common architecture used to implement an ADC function is the pipeline architecture [1]. The building blocks of a typical pipeline ADC are depicted in FIG. 1. The first block 100 is an optional dedicated sample-and-hold (SH) circuit that samples the input signal $V_{in}$ and buffers the signal to drive the subsequent stages. Each of the pipeline stages $110_i \ldots 110_{k-1}, 110_k$ after the optional front-end SH 100 resolve a number of bits. Each pipeline stage $110_i$ consists of a SH 120 to sample the input from a previous stage. An ADC 130 quantizes the held sample, and the digital output obtained is converted back to the analog domain by a digital to analog converter (DAC) 140. The resulting analog signal is subtracted by an adder 150 from the held sample, and the resulting signal is passed to an amplifier 160. The residue signal obtained after the subtraction point 150 is amplified by the amplifier 160 and fed to the next stage.

The functionality contained inside each pipeline stage $110_i$ can be implemented with a switched-capacitor circuit. In the last stage $110_k$, only the residue of the previous stage $110_{k-1}$ needs to be quantized. This functionality can therefore be implemented with only an ADC. The output bits from all of the stages are combined in the digital domain to form the final output word of the pipeline ADC.

The basic architecture of a switched-capacitor implementation of a pipeline stage circuit 110 is shown in FIG. 2a. Clock signals $\phi 1$, $\phi 2$ are used to control operation of the pipeline stage circuit 110. The clock signals are non-overlapping signals, as shown in FIG. 2b, i.e. when $\phi 1$ is high $\phi 2$ is low and vice versa. A slightly advanced version of the clock signal $\phi 1$ may be used, shown in FIGS. 2a and 2b as clock signal $\phi 1e$. Both clock signals $\phi 1$ and $\phi 1e$ are, at least when high, non-overlapping with the clock signal $\phi 2$. During the time $\phi 1$ and $\phi 1e$ are high the voltage on sampling capacitor $C_s$ tracks the input signal $V_{in}$, and feedback capacitor $C_f$ is discharged. On the falling edge of $\phi 1e$, slightly ahead of $\phi 1$, the instantaneous voltage on sampling capacitor $C_s$ is sampled and the ADC 130 is strobed to quantize the input. The advanced version $\phi 1e$ of the clock signal $\phi 1$ ensures that the critical sample moment is determined by the bottom-plate switch controlled by $\phi 1e$. This method of sampling is commonly known as bottom-plate sampling. The DAC 140 outputs an analog signal representing the quantized result of the ADC 130. During the time that $\phi 2$ is high the op-amp (operational amplifier) 210 maintains virtual ground at its inverting input, assuming it has sufficient open-loop gain, and sampling capacitor $C_s$ is charged to the DAC output voltage. Thereby an amount of charge is transferred to feedback capacitor $C_f$. This amount of charge $Q_\Delta$ is equal to $Q_q - Q_s$. The charge $Q_q$ is given by $C_s V_{DAC}$ and charge $Q_s$ by $C_s V_{in}(t_s)$. The residue output voltage $V_{out}$ is then given by:

$$V_{out} = -\frac{Q_\Delta}{C_f} = \frac{C_s}{C_f}(V_{in}(t_s) - V_{DAC}) \quad (1)$$

At the next period when $\phi 1$ and $\phi 1e$ are high again, sampling capacitor $C_s$ is connected to the input again to track the input signal $V_{in}$, and takes a new sample on the falling edge of $\phi 1e$. The DAC functionality in the basic architecture of a switched-capacitor pipeline stage, as shown in FIG. 2a as a separate block, can be implemented with a switched-capacitor circuit. The DAC 140 can share the same capacitor array already used for the sampling and subtraction action [2]. This so called MDAC (multiplying DAC) architecture of a switched-capacitor pipeline stage is shown in FIG. 3. The ADC is not drawn explicitly in this figure. An N-bit ADC, with $L=2^N$ levels, is typically comprised of $K=L-2$ comparators. The output bits of the K comparators $D_1$ to $D_K$ are used to indicate the operation of the switches. The ampersand symbol (&) represents logic AND, and the exclamation mark (!) represents logic NOT. To implement the DAC functionality a two-level reference is used and the sampling capacitor $C_s$ is split-up into a number of unit capacitors $C_u$, where $C_u = C_s/L$. Depending on the comparator outputs $D_1$ to $D_K$, each unit capacitor $C_s/L$ is switched to either $+V_{ref}$ or $-V_{ref}$ when $\phi 2$ is high. Thereby an amount of charge is transferred to feedback capacitor $C_{f1}$. This amount of charge $Q_\Delta$ is equal to $Q_q - KQ_u$. The charge $Q_q$ is equal to:

$$\begin{aligned} Q_q &= \frac{C_s}{L} D_1 V_{ref} + \cdots + \frac{C_s}{L} D_K V_{ref} - \\ & \quad \frac{C_s}{L} !D_1 V_{ref} - \cdots - \frac{C_s}{L} !D_K V_{ref} \\ &= \frac{C_s}{L}(D_1 - !D_1 + \cdots + D_K - !D_K) V_{ref} = \frac{C_s}{L} D V_{ref} \end{aligned} \quad (2)$$

The charge $Q_u$ is $(C_s/L)V_{in}(t_s)$. The residue output voltage then becomes:

$$V_{out} = -\frac{Q_{f1} - Q_\Delta}{C_{f1}} = \frac{L}{2}\left(V_{in}(t_s) - \frac{D}{L}V_{ref}\right) \quad (3)$$

The charge $Q_{f1}$, sampled on capacitor $C_{f1}$, is $(2C_s/L)V_{in}(t_s)$. This transfer is equal to that of equation 1 with $C_f$ substituted by $2C_s/L$, as in FIG. 3. A second feedback capacitor $C_{f2}$, having a first plate connected to the input of the op-amp and a second plate connected via two switches to the output $V_{out}$ of the op-amp when $\phi 2$ is high and to a common voltage when $\phi 1$ is high, can be added to scale the output range. The capacitor $C_s$ used to sample the input signal $V_{in}$ is now a distributed capacitor made up of K unit capacitors $C_s/L$ and feedback capacitor $C_{f1}$. When $\phi 1$ is high again, the distributed sample capacitor $C_s$ is connected to the input $V_{in}$ to track the input and to take a new sample on the falling edge of $\phi 1$.

For power efficiency it is advantageous to implement a large signal range in the frontend pipeline stage(s) and a smaller signal range for the backend pipeline stages. The signal range in prior-art pipeline stages, however, is set by the reference voltages used. The input signal range is limited by the supply voltage and required voltage headroom needed to buffer the reference voltages. To accommodate for a larger input voltage range or increased voltage headroom for the reference voltage buffers, the references also need to be scaled. It is therefore an object of the invention to allow both the gain and the required reference voltages to be scaled independently from each other.

In accordance with a first aspect, there is provided a method of designing a circuit for an N-bit stage of a pipeline ADC having $L=2^N$ levels, the circuit comprising:
an operational amplifier;
a first feedback capacitor having a first plate connected to an input of the operational amplifier and a second plate switchably connected on a first clock signal to a first input voltage and on a second clock signal to an output of the operational amplifier;

a second feedback capacitor having a first plate connected to the input of the operational amplifier and a second plate switchably connected on the first clock signal to a discharge connection and on the second clock signal to the output of the operational amplifier; and a plurality of K sampling capacitors, each sampling capacitor having a first plate connected to the input of the operational amplifier and a second plate switchably connected on the first clock signal to a second input voltage and on the second clock signal to one of a positive and a negative reference voltage dependent on a quantised value of an analog input signal, the method comprising the steps of:

for a given reference scaling factor H, determining the total capacitance value Cr of the plurality of K sampling capacitors and the capacitance value $C_{f1}$ of the first feedback capacitor according to the relationship $$C_{f1} = C_r\left(\frac{HL}{K} - 1\right);$$

and for a given stage gain G, determining the capacitance value $C_{f2}$ of the second feedback capacitor according to the relationship $$C_{f2} = \frac{C_r - C_{f1}}{G} - C_{f1}.$$

In accordance with a second aspect, there is provided a circuit for an N-bit stage of a pipeline ADC having $L=2^N$ levels, the circuit comprising:

an operational amplifier;

a first feedback capacitor having a first plate connected to an input of the operational amplifier and a second plate switchably connected on a first clock signal to a first input voltage and on a second clock signal to an output of the operational amplifier;

a second feedback capacitor having a first plate connected to the input of the operational amplifier and a second plate switchably connected on the first clock signal to a discharge connection and on the second clock signal to the output of the operational amplifier; and a plurality of K sampling capacitors, each sampling capacitor having a first plate connected to the input of the operational amplifier and a second plate switchably connected on the first clock signal to a second input voltage and on a second clock signal to one of a positive and negative reference voltage dependent on a quantised value of an analog input signal, wherein the second input voltage is of equal magnitude and opposite sign to the first input voltage.

In accordance with a third aspect, there is provided a method of designing a circuit for an N-bit stage of a pipeline ADC having $L=2^N$ levels, the circuit comprising:

an operational amplifier;

a feedback capacitor having a first plate connected to an input of the operational amplifier and a second plate switchably connected on a first clock signal to an input voltage and on a second clock signal to an output of the operational amplifier;

a first plurality of K sampling capacitors having a total capacitance value $C_{r1}$, each sampling capacitor having a first plate connected to the input of the operational amplifier and a second plate switchably connected on the first clock signal to the input voltage and on the second clock signal to one of a positive and negative reference voltage dependent on a quantised value of an input analog signal; and a second plurality of K sampling capacitors having a total capacitance value $C_{r2}$, each sampling capacitor having a first plate connected to the input of the operational amplifier and a second plate switchably connected on the first clock signal to a discharge connection and on the second clock signal to one of a positive and negative reference voltage dependent on the quantised value of the input analog signal, the method comprising the steps of:

for a given reference scaling factor H, determining the total capacitance value $C_r=C_{r1}+C_{r2}$ of the first and second plurality of K sampling capacitors and a distributed capacitance value $C_s$ of the circuit according to the relationship $$C_r = \frac{K}{HL}C_s,$$

where $C_s=C_{r1}+C_f$; and for a given stage gain G, determining the capacitance value $C_f$ of the feedback capacitor according to the relationship $$C_f = \frac{1}{G}C_s.$$

In accordance with a fourth aspect, there is provided a circuit for an N-bit stage of a pipeline ADC, the circuit having a design according to the third aspect.

In accordance with a fifth aspect, there is provided a circuit for an N-bit stage having $L=2^N$ levels of a pipeline ADC, the circuit comprising:

an operational amplifier;

a first feedback capacitor having a first plate connected to a non-inverting input of the operational amplifier and a second plate switchably connected on a first clock signal to a first input voltage and on a second clock signal to an inverting output of the operational amplifier;

a second feedback capacitor having a first plate connected to the non-inverting input of the operational amplifier and a second plate switchably connected on the first clock signal to a discharge connection and on the second clock signal to the inverting output of the operational amplifier;

a first plurality of K sampling capacitors, each sampling capacitor having a first plate connected to the non-inverting input of the operational amplifier and a second plate switchably connected on the first clock signal to a second input voltage and on a second clock signal to one of a positive and negative reference voltage dependent on a quantised value of an analog input signal;

a third feedback capacitor having a first plate connected to an inverting input of the operational amplifier and a second plate switchably connected on the first clock signal to the second input voltage and on a second clock signal to a non-inverting output of the operational amplifier;

a fourth feedback capacitor having a first plate connected to the inverting input of the operational amplifier and a second plate switchably connected on the first clock signal to the discharge connection and on the second clock signal to the non-inverting output of the operational amplifier;

a second plurality of K sampling capacitors, each sampling capacitor having a first plate connected to the inverting input of the operational amplifier and a second plate switchably connected on the first clock signal to the first input voltage and on a second clock signal to one of a positive and negative reference voltage dependent on a quantised value of an analog input signal, wherein the second input voltage is of equal magnitude and opposite sign to the first input voltage.

The invention is described, by way of example only, in the following sections with reference to the appended drawings, in which:

FIG. 2b is a diagram illustrating the first and second clock signals used in the pipeline stage of FIG. 2a;

FIG. 3b is a diagram illustrating the first and second clock signals used in the pipeline stage of FIG. 3a;

FIG. 4b is a diagram illustrating the first and second clock signals used in the pipeline stage of FIG. 4a;

FIG. 5b is a diagram illustrating the first and second clock signals used in the pipeline stage of FIG. 5a;

FIG. 6b is a diagram illustrating the first and second clock signals used in the pipeline stage of FIG. 6a.

FIGS. 1 to 3b have been described above in relation to the background to the invention.

The gain of a pipeline stage is typically $2^{N-1}$ to accommodate for 1 bit of over/under range in a subsequent pipeline stage. With this over/under range, errors caused by offset in the comparator and or reference voltages can to some extend be corrected in the digital domain. For power efficiency, it is advantageous to implement a large signal range in the front-end pipeline stage(s) and a smaller signal range for the back-end pipeline stages. Thus the freedom to choose any stage gain is advantageous in a front-end stage to scale the output signal range of the front-end stage to the signal range of the subsequent, or back-end, pipeline stages. The output of the op-amp in the front-end pipeline stage only needs to handle the signal voltage range of a subsequent pipeline stage.

The difference between the reference voltages $+V_{ref}$ and $-V_{ref}$ is equal to the (single-ended) input signal range. The source impedance of these reference voltages needs to be low to quickly charge the capacitive load. It is therefore necessary to buffer the reference voltages. Some voltage headroom is needed to bias the active devices in the reference buffers, which limits the reference voltage levels for a given supply voltage and thus the input voltage range. To accommodate a larger input voltage range or an increased voltage headroom for the active devices in the buffers, the reference voltage needs to be scaled. The exemplary pipeline stages described herein allow for scaling of both gain, to set the output signal range, and of the reference voltages, independent from each other. This is achieved by novel circuit architectures, as described below with reference to FIGS. 4a, 5a and 6a.

Figure 1:
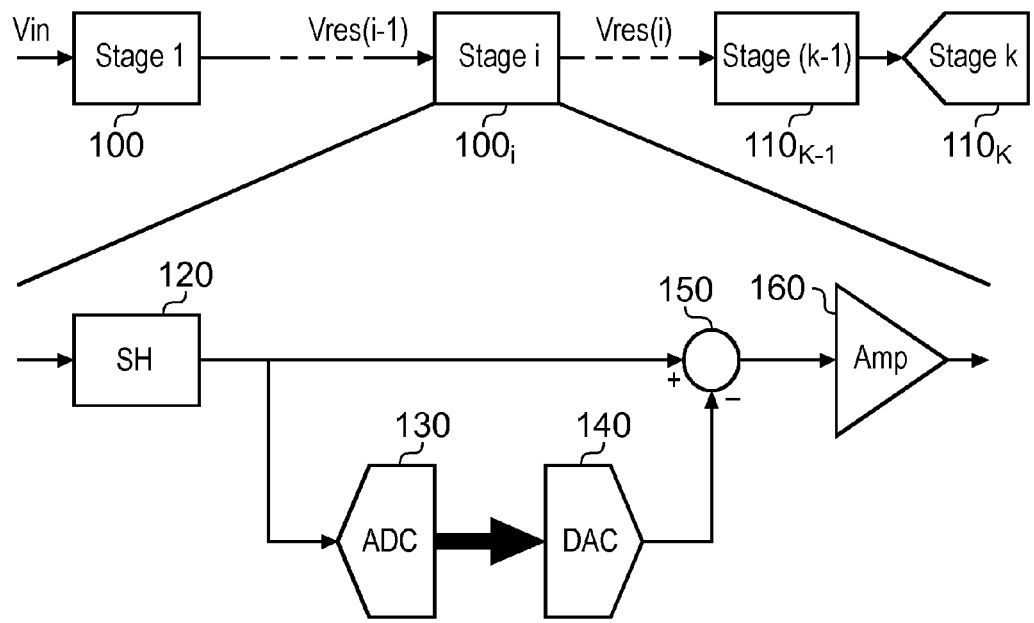
FIG. 1 is a schematic diagram of a typical pipeline ADC architecture.
Figure 2A:
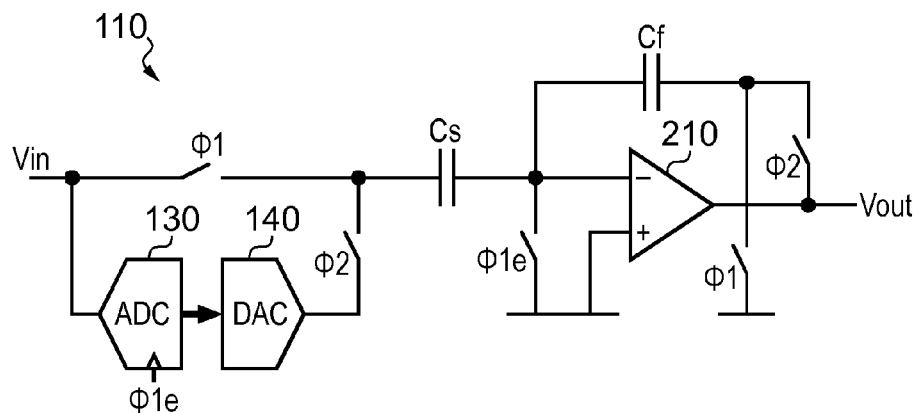
FIG. 2a is a diagram of a pipeline stage of a pipeline ADC architecture.
Figure 2B:
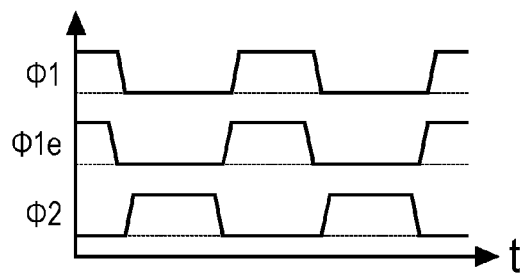
Figure 3A:
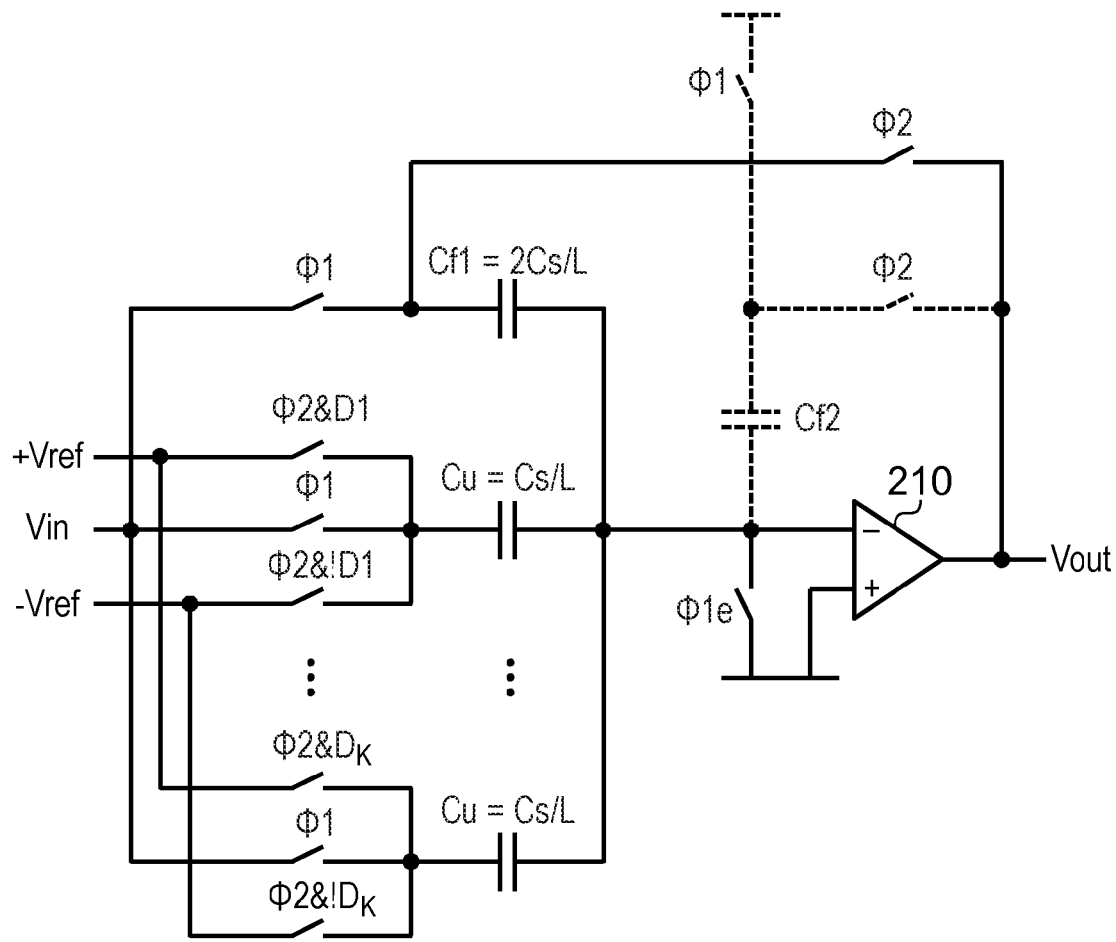
FIG. 3a is a circuit diagram of a multiplying DAC (MDAC) pipeline stage.
Figure 3B:
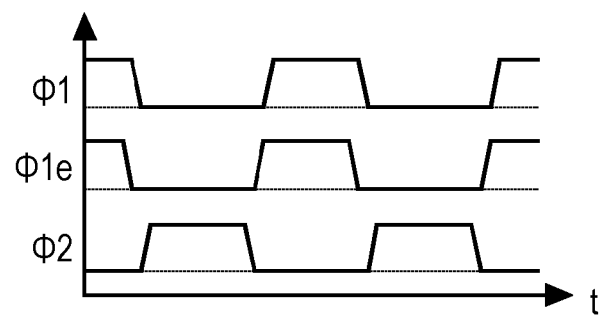
Figure 4A:
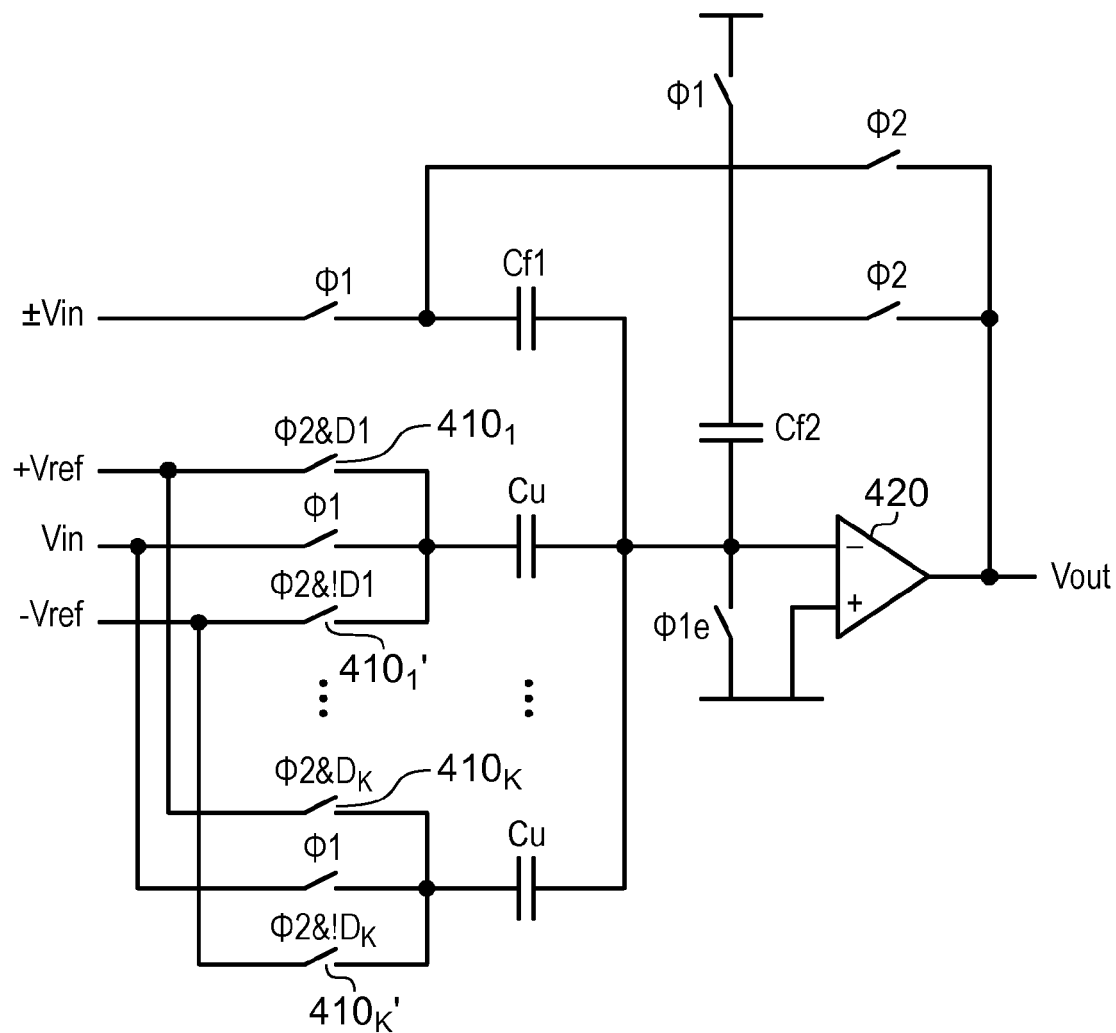
FIG. 4a is a circuit diagram of a pipeline stage with reference and range scaling.
Figure 4B:
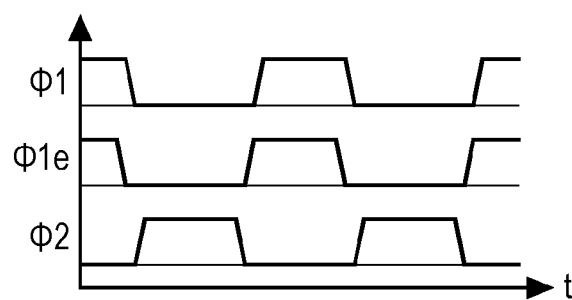

An exemplary implementation of a reference- and range-scaling pipeline stage architecture is shown in FIG. 4a, with the clock signals $\phi 1$, $\phi 1 e$ and $\phi 2$ shown in FIG. 4b. The ADC functionality used to quantize the input signal is not drawn explicitly in FIG. 4a. An N-bit ADC, with $L=2^N$ levels, is typically comprised of $K=L-2$ comparators, although alternative numbers of comparators can be used, such as $L-1$. The output bits of the K comparators $D_1$ to $D_K$ are used to indicate operation of corresponding switches $410_1$, $410_1'$ to $410_K$, $410_K'$. The ampersand symbol (&) adjacent each switch represents logic AND, while the exclamation mark (!) represents logic NOT. For example, switch $410_1$ is open when clock signal $\phi 2$ is low or when $D_1$ is low, and is closed only when both clock signal $\phi 2$ and $D_1$ are high. When $\phi 1$ is high, the voltage on the distributed capacitor $C_s$, which is made up of K unit capacitors $C_u$ and feedback capacitor $C_{f1}$, tracks the input voltage $V_{in}$. For at least part of the time when $\phi 2$ is low, for example on clock signal $\phi 1$, feedback capacitor $C_{f2}$ is discharged by being connected to a common voltage (ground), acting as a discharge connection. Feedback capacitor $C_{f2}$ could alternatively, for example, be discharged by providing a switched connection in parallel to the capacitor that is activated when $\phi 1$ is high. This would have the same effect as that in the circuit shown in FIG. 4a. In a differential circuit arrangement, the feedback capacitors $C_{f2}$ in each half of the circuit can be connected together to discharge them when $\phi 1$ is high, i.e. a discharge connection being made by connecting the capacitors together.

Depending on the scaling factor used for the reference voltage, it is necessary to connect capacitor $C_{f1}$ to either a positive or a negative version of the input voltage, i.e. $\pm V_{in}$. For simplicity, only one half of a differential circuit is drawn in FIG. 4, but when $C_{f1}$ needs to be connected to the negative input it will be connected to the other (negative) half of the differential circuit and from the other (negative) half an equal sized capacitor will be connected to a positive version of the input voltage $V_{in}$. Therefore, the total capacitance of the distributed capacitor $C_s$ used to sample the (positive) input voltage does not change.

On the falling edge of $\phi 1 e$ the instantaneous voltage on the distributed sampling capacitor Cs is sampled and the ADC is strobed to quantize the input. To implement the DAC functionality a two-level reference is used. Depending on the comparator decisions $D_1$ to $D_K$, each of the unit capacitors $C_u$ are switched to either $+V_{ref}$ or $-V_{ref}$ when $\phi 2$ is high. During the time that $\phi 2$ is high the op-amp 420 maintains virtual ground at its inverting input, assuming it has sufficient open-loop gain. The unit capacitors $C_u$ are thereby charged to a voltage of $\pm V_{ref}$, depending on the comparator outputs, transferring an amount of charge to the feedback capacitor $C_f$. Capacitor $C_f$ is the parallel combination of capacitors $C_{f1}$ and $C_{f2}$. This amount of charge $Q_\Delta$ is equal to $Q_q - KQ_u$, where $Q_q$ is given by:

$$Q_q = C_u D_1 V_{ref} + \cdots + C_u D_K V_{ref} - \quad (4)$$
$$C_u ! D_1 V_{ref} - \cdots - C_u ! D_K V_{ref}$$
$$= C_u (D_1 - ! D_1 + \cdots + D_K - ! D_K) V_{ref} = C_u D V_{ref}$$

The charge $Q_u$ is $C_u V_{in}(t_s)$, and charge $Q_\Delta$ is given by:

$$Q_\Delta = C_u (DV_{ref} - KV_{in}(t_s)) \quad (5)$$

Initially capacitor $C_{f1}$ already holds a charge $Q_{f1}$ that is equal to $\pm C_{f1} V_{in}(t_s)$. Whether capacitor $C_{f1}$ was connected to the positive or negative input during the time $\phi 1$ was high determines the sign of $Q_{f1}$. When the charge redistribution settles, the residue output voltage becomes:

$$V_{out} = \frac{\pm Q_{f1} - Q_\Delta}{C_f} = \frac{\pm C_{f1} + KC_u}{C_f}V_{in}(t_s) - \frac{C_u}{C_f}DV_{ref} \quad (6)$$

Substituting for $KC_u = C_r$ into equation 6 and rearranging gives the following:

$$V_{out} = \frac{C_r \pm C_{f1}}{C_f}\left(V_{in}(t_s) - \frac{C_r}{C_r \pm C_{f1}}\frac{D}{K}V_{ref}\right) \quad (7)$$

For correct DAC operation the following constraint must hold:

$$\frac{C_r}{C_r \pm C_{f1}} = \frac{K}{L} \quad (8)$$

This is because the voltage subtracted from Vin by the MDAC before amplification is required to be a correct subdivision of the input range, in accordance with the value of D.

Equation 8 holds when the voltage $V_{ref}$ is equal to the maximum amplitude of the input signal voltage range. When the reference voltage $V_{ref}$ is scaled with a factor H the constraint then becomes:

$$\frac{C_r}{C_r \pm C_{f1}} = \frac{K}{HL} \quad (9)$$

Equation 9 has two degrees of freedom. A second constraint, which can be chosen freely, is needed to solve the equation. Here the value of the distributed sample capacitor $C_s$ is used to set the second constraint:

$$C_s = C_r \pm C_{f1} \quad (10)$$

Using equations 9 and 10, the required values for $C_r$ and $C_{f1}$ can be calculated for a given reference scaling factor H:

$$C_r = \frac{K}{HL}C_s \quad (11)$$
$$C_{f1} = C_s - C_r = \left(1 - \frac{K}{HL}\right)C_s = \left(1 - \frac{K}{HL}\right)\frac{HL}{K}C_r = \left(\frac{HL}{K} - 1\right)C_r$$

When the reference gain H is chosen smaller than K/L, capacitor $C_r$ becomes larger than $C_s$ and capacitor $C_{f1}$ needs to have a negative value to fulfill the constraint set in equation 10. This is clearly not physically possible. However, if capacitor $C_{f1}$ holds a charge of −Q rather than +Q, this has the same effect as using a 'negative' capacitor value for the solution of equation 10. Therefore, in FIG. 4a, capacitor $C_{f1}$ is connected to $-V_{in}$ during the time φ1 is high, for the case where H is smaller than K/L.

The gain G of the pipeline stage can be directly identified from equation 7 to be:

$$G = \frac{C_r \pm C_{f1}}{C_f} \quad (12)$$

When the constraint of equation 10 is applied to equation 12, the required value of $C_f$ for a given gain G can be given by:

$$C_f = \frac{1}{G}C_s \quad (13)$$

Using the relation $C_f = |C_{f1}| + C_{f2}$, the value of the feedback capacitor $C_{f2}$ is given by:

$$C_{f2} = C_f - |C_{f1}| = \frac{C_r \pm C_{f1}}{G} - |C_{f1}| \quad (14)$$

When the pipeline stage is in its amplification phase during the time φ2 is high, the sign of the charge sampled on capacitor $C_{f1}$ during the time φ1 was high does not have the effect of a negative capacitance in this equation, therefore the absolute value of capacitor $C_{f1}$ is used above. The feedback factor k of the pipeline stage is given by:

$$k = \frac{C_f}{C_f + C_r} = \frac{HL}{HL + GK} \quad (15)$$

For a 4-bit pipeline stage with a $2V_{pp}$ differential input range and a required differential output voltage range of $0.8V_{pp}$, the gain G of the stage needs to be 3.2. This gain is chosen to accommodate for 1 bit of over/under range to allow digital error correction. When a reference voltage $V_{ref}$ of ±0.4V is used, the required capacitor values can be calculated to be as follows:

$$N = 4, L = 16, K = 14 \text{ and } H = \frac{4}{5} \quad (16)$$
$$C_r = 1\frac{3}{32}C_s \text{ and } C_u = \frac{5}{64}C_s$$
$$C_{f1} = -\frac{3}{32}C_s$$
$$C_{f2} = \frac{7}{32}C_s$$

Using the above parameters for a pipeline stage, the reference scaling factor H is ⅘, which is smaller than K/L=⅞. Therefore a negative value is obtained for $C_{f1}$. This negative value is obtained, as explained above, by sampling a negative charge on capacitor $C_{f1}$. Therefore the capacitor $C_{f1}$ with a capacitance value of $|C_{f1}|$ from equation 16 is connected to the negative input $-V_{in}$ of the differential circuit. The sample capacitor $C'_s$ in the circuit, which is the parallel combination of capacitors $C_r$ and $|C_{f1}|$, will have a capacitance greater than Cs. To obtain a sample capacitance $C'_s$ that is equal to Cs, all the capacitors need to be scaled with a factor S, given by:

$$S = \frac{C_r + |C_{f1}|}{C_r \pm C_{f1}} \quad (17)$$

For example, if a sample capacitance $C_s$ of 5.32 pF is required to obtain a desired noise figure for the pipeline stage, the final capacitance values are given by:

$$C_u = 350 \text{ fF}; C_{f1} = 420 \text{ fF and } C_{f2} = 980 \text{ fF} \quad (18)$$

Figure 5A:
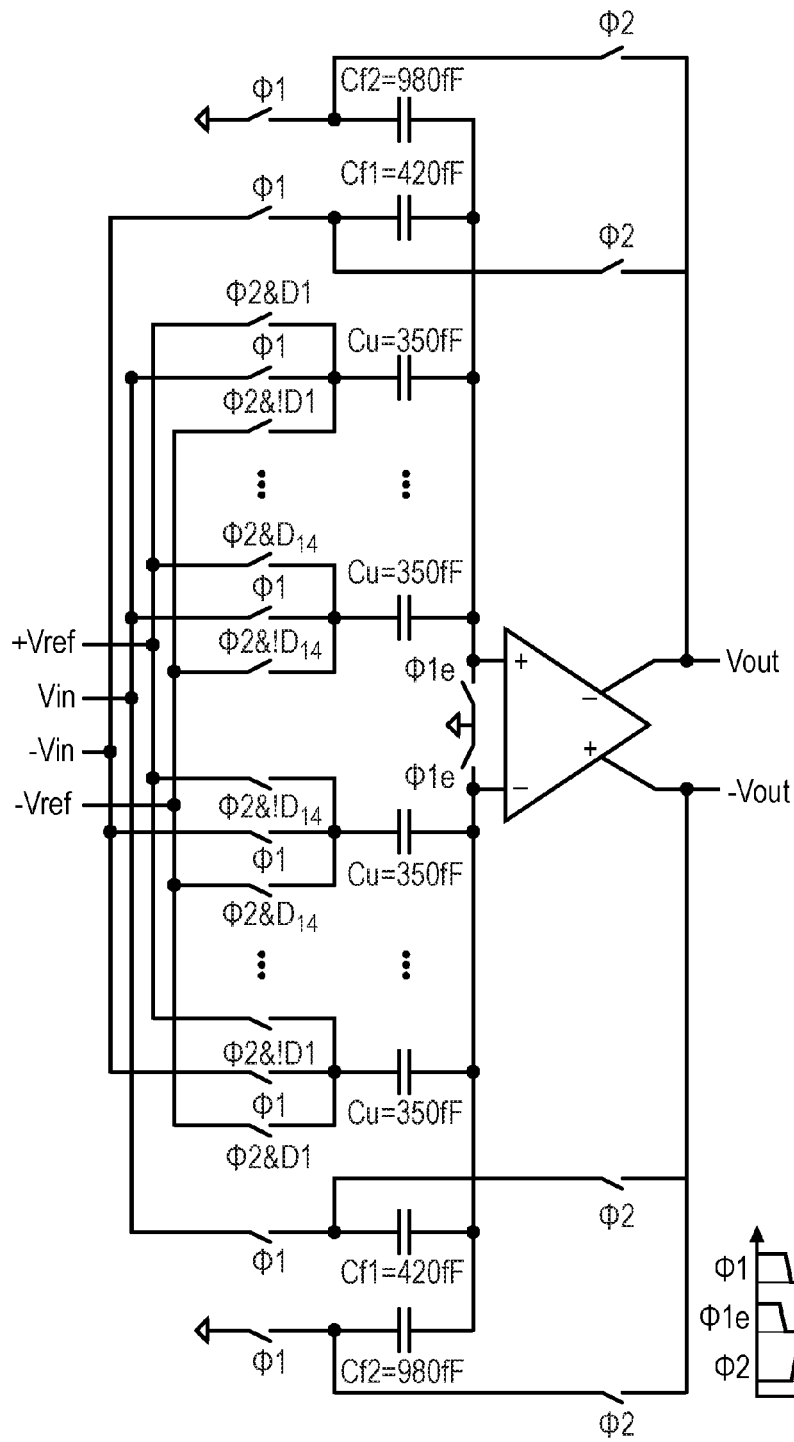
FIG. 5a is a circuit diagram of a differential pipeline stage with reference and range scaling.
Figure 5B:
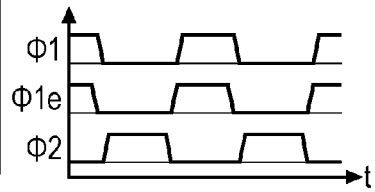

A differential reference and range-scaling pipeline stage with the calculated values given above is shown in FIG. 5a, with the clock signals φ1, φ1e and φ2 shown in FIG. 5b. The arrangement is similar to that of the single-sided embodiment of FIG. 4a, but with one half connected to the non-inverting input and inverting output of the op-amp, while the other half is connected to inverting input and non-inverting output of the op-amp. Positive and negative versions of the input voltage Vin are applied to respective halves of the differential amplifier, with −Vin connected to the sampling capacitors Cu on the inverting side of the op-amp and to the feedback capacitor Cf1 on the non-inverting side of the op-amp, and vice versa. Feedback capacitors $C_{f2}$ are discharged on clock signal φ1 to a common discharge connection, which may be ground or another connection common to both capacitors.

Figure 6A:
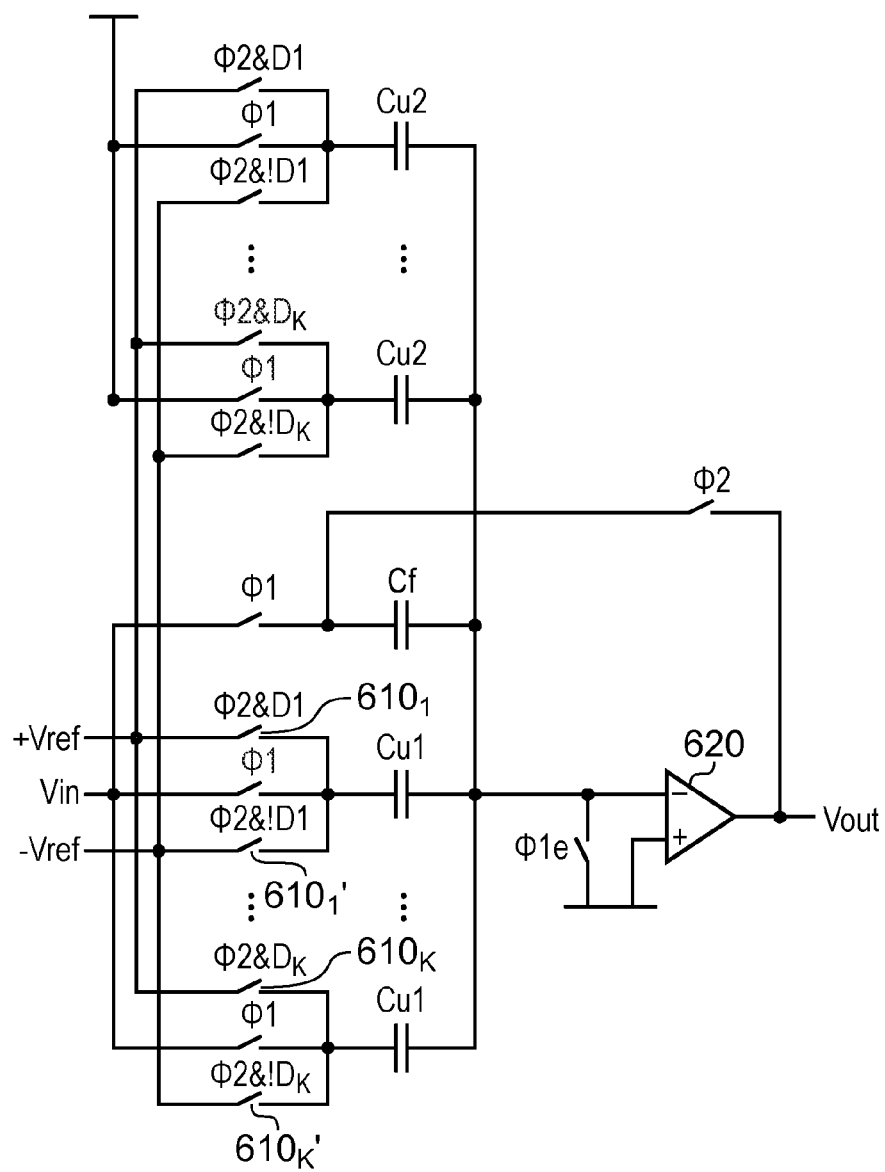
FIG. 6a is a circuit diagram of an alternative pipeline stage with reference and range scaling.
Figure 6B:
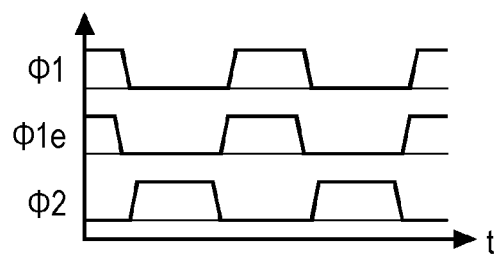

An alternative embodiment of a reference and range-scaling pipeline stage is shown in FIG. 6a, with the associated clock signals φ1, φ1e and φ2 shown in FIG. 6b. A further K−1 additional capacitors and 3K−2 additional switches are used for a single-ended implementation. The feedback factor of this alternative embodiment is the same as the first embodiment described above. The ADC functionality used to quantize the input signal is not drawn explicitly in FIG. 6a.

As for the first embodiment, an N-bit ADC, with L=2N levels, is made up of K=L−2 comparators. The output bits of the K comparators $D_1$ to $D_K$ are used to control the operation of switches $610_1$, $610_1'$ to $610_K$, $610_K'$. The ampersand symbol (&) represents logic AND, while the exclamation mark (!) represents logic NOT. During the time φ1 is high, a voltage on the distributed capacitor $C_s$, made up of K unit capacitors $C_{u1}$ and capacitor $C_f$, tracks the input voltage $V_{in}$. The other K unit capacitors $C_{u2}$ are discharged by being connected to a common voltage (or ground). On the falling edge of φ1e the instantaneous voltage on capacitor $C_s$ is sampled and the ADC is strobed to quantize the input. To implement the DAC functionality a two-level reference is used. Depending on the comparator decisions $D_1$ to $D_K$, a unit capacitor $C_u$, made up of a pair of unit capacitors $C_{u1}$ and $C_{ue}$, is switched to either $+V_{ref}$ or $-V_{ref}$ when φ2 is high.

During the time that φ2 is high, the op-amp 620 maintains virtual ground at its negative, or inverting, input, assuming it has sufficient open-loop gain. The unit capacitors $C_u$ are thus charged to a voltage of $\pm V_{ref}$, depending on the comparator decisions $D_1$ to $D_K$. Thereby an amount of charge is transferred to the feedback capacitor $C_f$. This amount of charge $Q_\Delta$ is equal to $Q_q - KQ_{u1}$, the charge $Q_q$ being given by:

$$Q_q = C_u D_1 V_{ref} + \cdots + C_u D_K V_{ref} \quad (19)$$
$$- C_u !D_1 V_{ref} - \cdots - C_u !D_K V_{ref}$$
$$= C_u (D_1 - !D_1 + \cdots + D_K - !D_K) V_{ref} = C_u D V_{ref}$$

The charge $Q_{u1}$ is $C_{u1} V_{in}(t_s)$, and thus charge $Q_\Delta$ is given by:

$$Q_\Delta = C_u D V_{ref} - K C_{u1} V_{in}(t_s) \quad (20)$$

Initially capacitor $C_f$ already holds a charge $Q_f$ that is equal to $C_f V_{in}(t_s)$. When the charge redistribution settles, the residue output voltage becomes:

$$V_{out} = \frac{Q_f - Q_\Delta}{C_f} = \frac{C_f + KC_{u1}}{C_f} V_{in}(t_s) - \frac{C_u}{C_f} D V_{ref} \quad (21)$$

After substituting $KC_{u1} = C_{r1}$ and $KC_{u2} = C_{r2}$ into equation 21 and rearranging, equation 21 becomes:

$$V_{out} = \frac{C_f + C_{r1}}{C_f} \left( V_{in}(t_s) - \frac{C_r}{C_{r1} + C_f} \frac{D}{K} V_{ref} \right) \quad (22)$$

For a correct DAC operation, the following constraint applies:

$$\frac{C_r}{C_{r1} + C_f} = \frac{K}{L} \quad (23)$$

Equation 23 holds when the voltage $V_{ref}$ is equal to the maximum amplitude of the input signal voltage range. When the reference voltage $V_{ref}$ is scaled with a factor H, the constraint becomes:

$$\frac{C_r}{C_{r1} + C_f} = \frac{K}{HL} \quad (24)$$

Equation 24 has two degrees of freedom. A second constraint, which can be chosen freely, is needed to solve the equation. Here the value of the distributed sample capacitor $C_s$ is used to set the second constraint:

$$C_s = C_{r1} + C_f \quad (25)$$

Using equations 24 and 25 above, the required values for $C_r$ can be calculated for a given reference scaling factor H as follows:

$$C_r = \frac{K}{HL} C_s \quad (26)$$

The gain G of the pipeline stage can be directly identified from equation 22 to be:

$$G = \frac{C_f + C_{r1}}{C_f} \quad (27)$$

When the constraint formulated in equation 25 is applied to equation 27, the required value of $C_f$ for a given gain G is given by:

$$C_f = \frac{1}{G} C_s \quad (28)$$

Using the relation $C_r = C_{r1} + C_{r2}$, the constraint formulated in equation 25 and the result of equations 27 and 28, the required values for $C_{r1}$ and $C_{r2}$ are given by:

$$C_{r1} = (G-1) C_f = \frac{G-1}{G} C_s \quad (29)$$

$$C_{r2} = C_r - C_{r1} = \frac{GK - HL(G-1)}{GHL} C_s$$

The feedback factor k of the pipeline stage is then given by:

$$k = \frac{C_f}{C_f + C_r} = \frac{HL}{HL + GK} \quad (30)$$

Other embodiments are intentionally within the scope of the invention, which is to be defined by the following claims.

REFERENCES

[1] S. H. Lewis and P. R. Gray. "A Pipelined 5-Msample/s 9-bit Analog-to-Digital Converter", *IEEE Journal of Solid-State Circuits*, SC-22:954-961, 1987.
[2] S. H. Lewis et al. "A 10-b 20-Msample/s Analog-to-Digital Converter", *IEEE Journal of Solid-State Circuits*, 27:351-358, 1992.

The invention claimed is:

1. A method of designing a circuit for an N-bit stage having $L=2^N$ levels of a pipeline ADC, the circuit including:
   an operational amplifier;
   a first feedback capacitor having a first plate connected to an input of the operational amplifier and a second plate switchably connected on a first clock signal to a first input voltage and on a second clock signal to an output of the operational amplifier;
   a second feedback capacitor having a first plate connected to the input of the operational amplifier and a second plate switchably connected on the first clock signal to a discharge connection and on the second clock signal to the output of the operational amplifier; and
   a plurality of K sampling capacitors, each sampling capacitor having a first plate connected to the input of the operational amplifier and a second plate switchably connected on the first clock signal to a second input voltage and on the second clock signal to one of a positive and a negative reference voltage dependent on a quantised value of an analog input signal,
   the method comprising the steps of:
   for a given reference scaling factor H, determining a total capacitance value Cr of the plurality of K sampling capacitors and a capacitance value $C_{f1}$ of the first feedback capacitor according to a relationship $$C_{f1} = C_r\left(\frac{HL}{K} - 1\right);$$

and
for a given stage gain G, determining a capacitance value $C_{f2}$ of the second feedback capacitor according to a relationship $$C_{f2} = \frac{C_r - C_{f1}}{G} - C_{f1}.$$

2. The method of claim 1 wherein the first input voltage signal is equal in magnitude and sign to the second input voltage signal.

3. The method of claim 1 wherein the first input voltage signal is equal in magnitude and opposite in sign to the second input voltage signal.

4. The method of claim 1 wherein K=L−2.

5. The method of claim 1, further comprising the step of making the circuit according to the design.

6. A circuit for a stage of an N-bit pipeline ADC, the circuit having a design according to claim 1.

7. A circuit for an N-bit stage having $L=2^N$ levels of a pipeline ADC, the circuit comprising:
   an operational amplifier;
   a first feedback capacitor having a first plate connected to an input of the operational amplifier and a second plate switchably connected on a first clock signal to a first input voltage and on a second clock signal to an output of the operational amplifier;
   a second feedback capacitor having a first plate connected to the input of the operational amplifier and a second plate switchably connected on the first clock signal to a discharge connection and on the second clock signal to the output of the operational amplifier; and
   a plurality of K sampling capacitors, each sampling capacitor having a first plate connected to the input of the operational amplifier and a second plate switchably connected on the first clock signal to a second input voltage and on a second clock signal to one of a positive and a negative reference voltage dependent on a quantised value of an analog input signal,
   wherein the second input voltage is of equal magnitude and opposite sign to the first input voltage.

8. The circuit according to claim 7 wherein a total capacitance value $C_r$ of the plurality of K sampling capacitors is related to a capacitance value $C_{f1}$ of the first feedback capacitor by the relationship $$C_{f1} = C_r\left(\frac{HL}{K} - 1\right),$$

where H is a reference scaling factor of the circuit, and wherein a capacitance value $C_{f2}$ of the second feedback capacitor is related to the capacitance value of the first feedback capacitor and a total capacitance value of the plurality of K sampling capacitors according to a relationship $$C_{f2} = \frac{C_r - C_{f2}}{G} - C_{f1},$$

where G is a stage gain of the circuit.

9. The circuit according to claim 7 wherein K=L−2.

10. A circuit for an N-bit stage having $L=2^N$ levels of a pipeline ADC, the circuit comprising:
   an operational amplifier;
   a first feedback capacitor having a first plate connected to a non-inverting input of the operational amplifier and a second plate switchably connected on a first clock signal to a first input voltage and on a second clock signal to an inverting output of the operational amplifier;
   a second feedback capacitor having a first plate connected to the non-inverting input of the operational amplifier and a second plate switchably connected on the first clock signal to a discharge connection and on the second clock signal to the inverting output of the operational amplifier;
   a first plurality of K sampling capacitors, each sampling capacitor having a first plate connected to the non-inverting input of the operational amplifier and a second plate switchably connected on the first clock signal to a second input voltage and on a second clock signal to one of a positive and negative reference voltage dependent on a quantised value of an analog input signal;

a third feedback capacitor having a first plate connected to an inverting input of the operational amplifier and a second plate switchably connected on the first clock signal to the second input voltage and on a second clock signal to a non-inverting output of the operational amplifier;

a fourth feedback capacitor having a first plate connected to the inverting input of the operational amplifier and a second plate switchably connected on the first clock signal to the discharge connection and on the second clock signal to the non-inverting output of the operational amplifier; and a second plurality of K sampling capacitors, each sampling capacitor having a first plate connected to the inverting input of the operational amplifier and a second plate switchably connected on the first clock signal to the first input voltage and on a second clock signal to one of a positive and a negative reference voltage dependent on a quantised value of an analog input signal, wherein the second input voltage is of equal magnitude and opposite sign to the first input voltage.

* * * * *